United States Patent [19]
Hattori et al.

[11] Patent Number: 5,348,792
[45] Date of Patent: Sep. 20, 1994

[54] MULTILAYERED WIRING BOARD WITH WIRING CONFIGURATIONS TO REDUCE CROSSTALK

[75] Inventors: Hisao Hattori; Tomohiko Ihara; Hiroshi Yoshino; Shosaku Yamanaka, all of Itami, Japan

[73] Assignee: Sumitomo Electric Industries, Ltd., Osaka, Japan

[21] Appl. No.: 47,492

[22] Filed: Apr. 19, 1993

[30] Foreign Application Priority Data

Apr. 20, 1992 [JP] Japan .................... 4-099427
Apr. 20, 1992 [JP] Japan .................... 4-099579
Feb. 4, 1993 [JP] Japan .................... 5-017517

[51] Int. Cl.$^5$ ............................... B32B 9/00
[52] U.S. Cl. .......................... 428/209; 428/901; 428/457; 361/748; 361/751
[58] Field of Search ........... 428/209, 210, 457, 458, 428/459, 901; 361/748, 750, 751, 777

[56] References Cited

U.S. PATENT DOCUMENTS 4,801,489  1/1989  Nakagawa .................... 428/209
4,907,127  3/1990  Lee .................................. 174/266

FOREIGN PATENT DOCUMENTS 276453    5/1989  Japan .
2233157   2/1991  United Kingdom .......... 428/901

OTHER PUBLICATIONS

Patent Abstracts of Japan, vol. 11, No. 17 (E-471) Jan. 17, 1987.
Patent Abstracts of Japan, vol. 14, No. 216 (E-924) May 8, 1990.
Patent Abstracts of Japan, vol. 15, No. 390 (E-1118) Oct. 3, 1991.
John Shurboff, "Polyimide Dielectric on Hybrid Multilayer Circuits", 1983 IEEE, pp. 610–615.
Moriya et al., "High-Density Multilayer Interconnection with Photo-Sensitive Polyimide Dielectric and Electroplating Conductor", 1984 IEEE, pp. 82–87.
Kimijima et al., "High-Density Multichip Module by Chip-On-Water Technology", ISHM 1988 Proceedings, pp. 314–319.
Scarlett, "Multilayer Printed Circuit Board Handbook", pp. 530–569, 1985.

*Primary Examiner*—Patrick J. Ryan
*Assistant Examiner*—Patrick Jewik
*Attorney, Agent, or Firm*—Wenderoth, Lind & Ponack

[57] ABSTRACT

This multilayered wiring board having a multilayered wiring structure includes a first mesh wiring layer having a plurality of holes therein, and a second wiring layer having a plurality of wirings. The wirings of the second wiring layer undulate up and down so as to descend towards the holes formed in the first wiring layer. In another arrangement, the first wiring layer has a plurality of protrusions protruding toward the second wiring layer at locations between adjacent ones of the wirings of the second wiring layer. In these wiring boards, crosstalk between the wirings is suppressed.

7 Claims, 9 Drawing Sheets

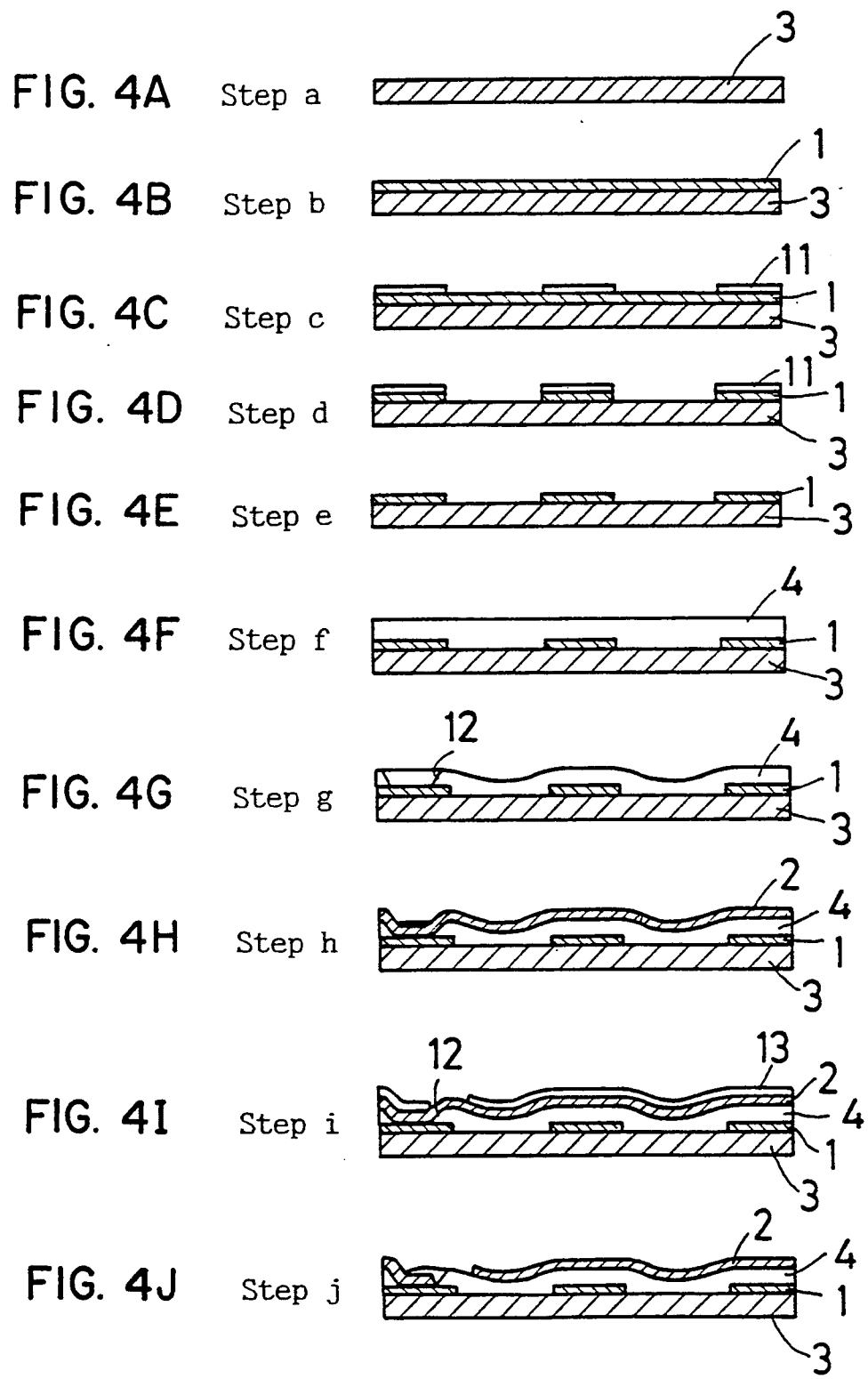

FIG. 8
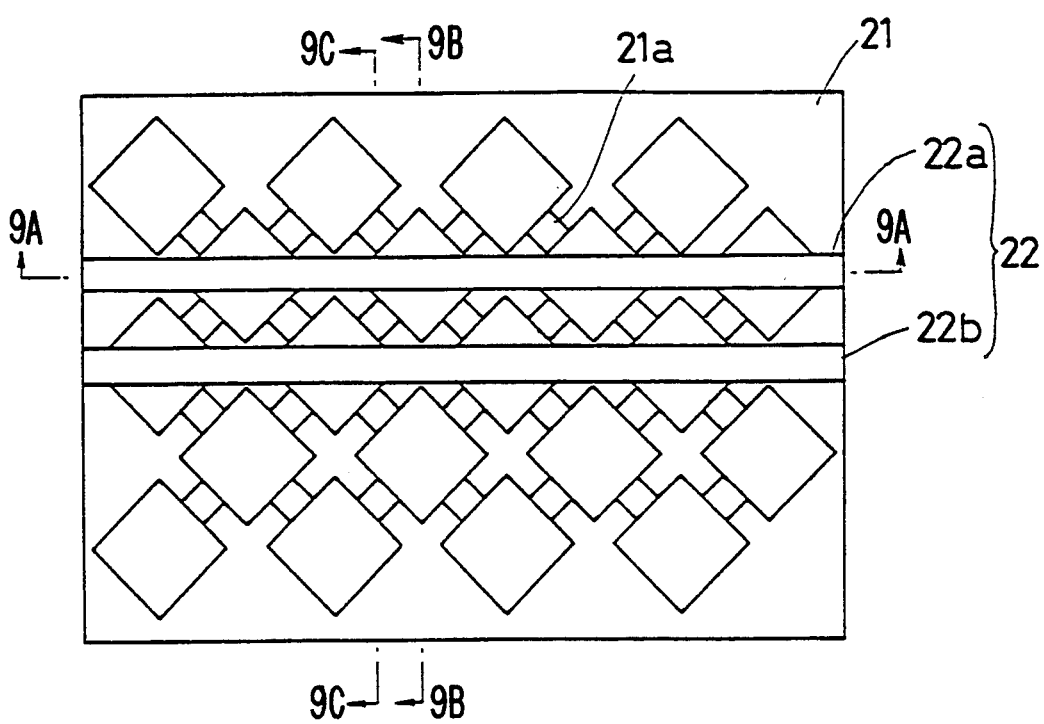
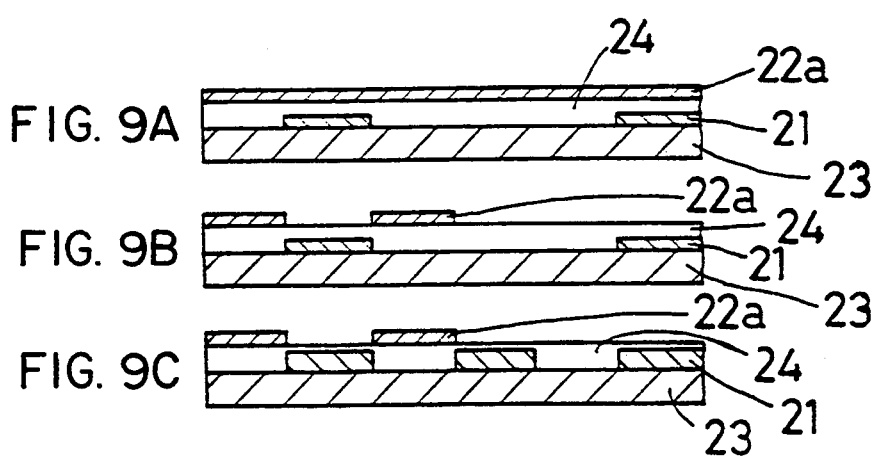
FIG. 9A
FIG. 9B
FIG. 9C

FIG. 10A Step a 
FIG. 10B Step b 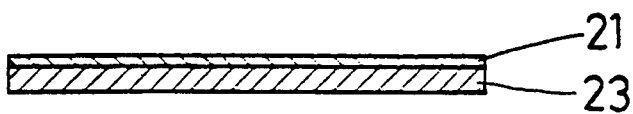
FIG. 10C Step c 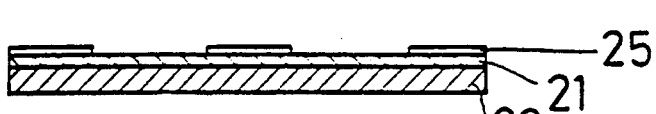
FIG. 10D Step d 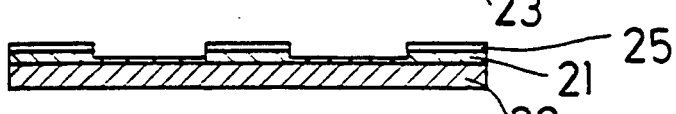
FIG. 10E Step e 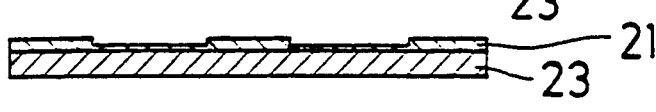
FIG. 10F Step f 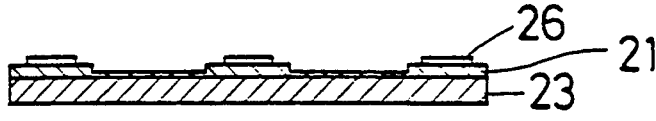
FIG. 10G Step g 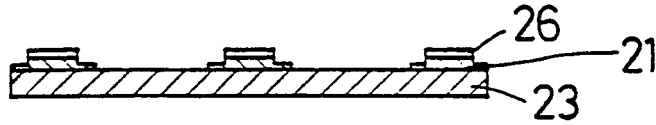
FIG. 10H Step h 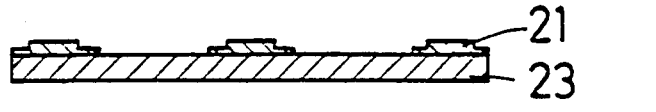
FIG. 10I Step i 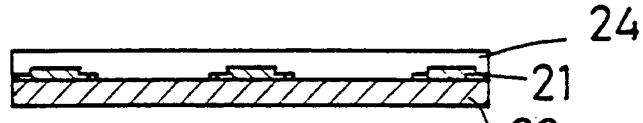
FIG. 10J Step j 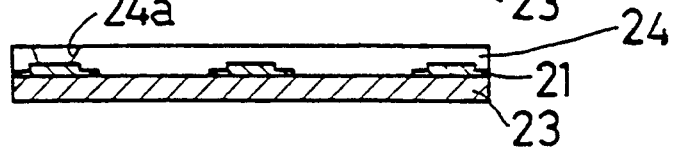
FIG. 10K Step k 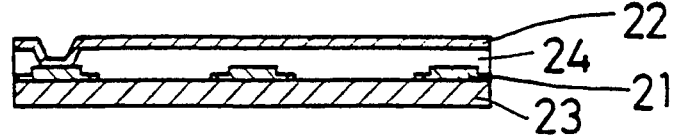
FIG. 10L Step l 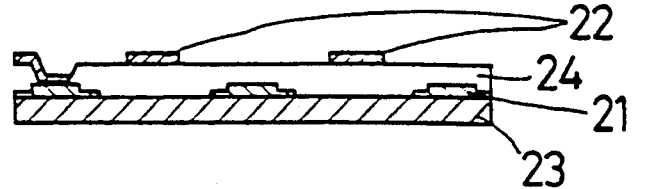

FIG. 12A Step a
FIG. 12B Step b
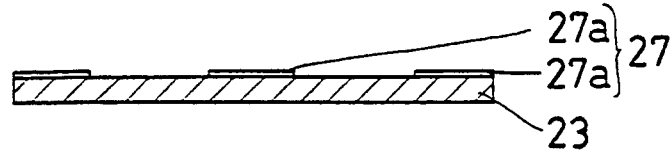
FIG. 12C Step c
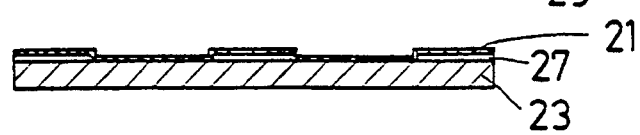
FIG. 12D Step d
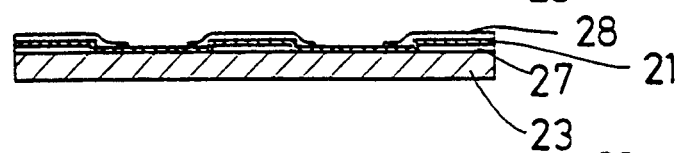
FIG. 12E Step e
FIG. 12F Step f
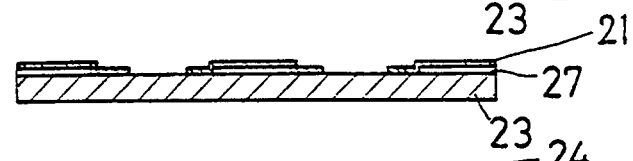
FIG. 12G Step g
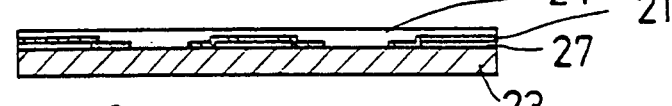
FIG. 12H Step h
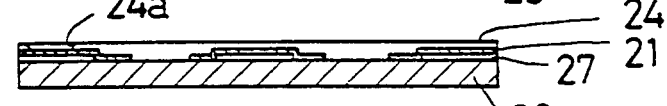
FIG. 12I Step i
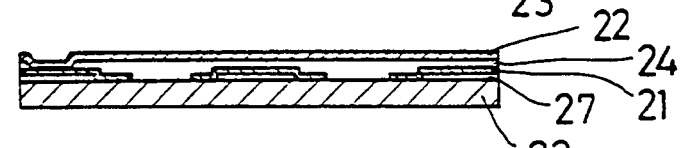
FIG. 12J Step j
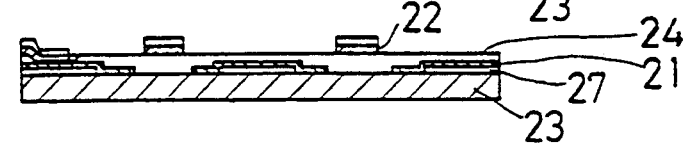
FIG. 12K Step k
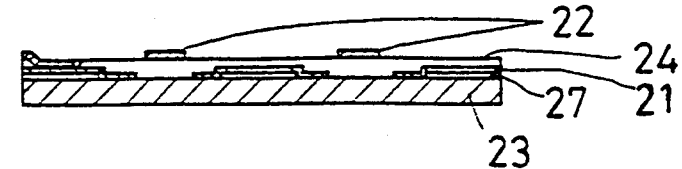

MULTILAYERED WIRING BOARD WITH WIRING CONFIGURATIONS TO REDUCE CROSSTALK

BACKGROUND OF THE INVENTION

This invention relates to a multilayered wiring board carrying a semiconductor device chip and a method for manufacturing the same.

Many of today's microprocessors and memory devices are provided with a multilayered wiring board on which semiconductor device chips and the like are mounted in order to achieve high-density packaging, Such a multilayered wiring board comprises a board of Si, $Al_2O_3$ or AlN, and insulating layers made of $SiO_2$ or polyimide and wiring layers of Al or Cu, which are alternately laminated on one another, The wiring layers have predetermined wiring patterns formed by combining photolithography, etching and plating. If it is necessary to connect the wiring layers together, they are connected together through via formed in the insulating layers interposed between the adjacent wiring layers.

The wiring layers may have mesh patterns with numerous holes formed therein, Such mesh wiring layers are disclosed in Japanese Unexamined Patent Publications 2-231749 and 3-158002. Such mesh patterns are used to adjust the distributed constant between these layers and the adjacent other layers.

Besides the requirement for high-density packaging, recent microprocessors and memory devices, which operate at an increasingly high speed, are faced with the problem crosstalk produced on the wiring layers of the multilayered wiring board. Namely, the higher the wiring density of the wiring layers and the higher the processing speed, the larger the crosstalk tend to be. Such crosstalk can cause a malfunction of the semiconductor device chip mounted on the multilayered wiring board.

By providing a mesh wiring layer, it becomes possible to adjust the distributed constant between mesh wiring layer and the layers adjacent thereto. However it was impossible to suppress crosstalk between the wirings in one wiring layer.

SUMMARY OF THE INVENTION

An object of this invention is therefore to reduce crosstalk between the wirings in a wiping layer.

In order to solve the above problems, according to the present invention, there is provided a multilayered wiring board having a multilayered wiring structure comprising a first mesh wiring layer having a plurality of holes formed therein, and a second wiring layer having a plurality of wirings undulating up and down so as to partially descent into the holes formed in the first wiring layer (First embodiment of the wiring board).

According to the present invention, there is provided a method for manufacturing a multilayered wiring board comprising: a first step of forming a mesh-shaped first wiring layer having a plurality of holes formed therein; a second step of forming an insulating layer on the first wiring layer; a third step of forming recesses in the insulating layer at portions right over the holes formed in the first wiring layer; and, a fourth step of forming a second wiring layer comprising a plurality of wirings which partially descended into the recesses in the insulating layer. (First embodiment of the method)

According to the present invention, there is also provided a multilayered wiring board having a multilayered wiring structure, comprising a first mesh wiring layer having a plurality of holes formed therein; and a second wiring layer having a plurality of wirings: the first wiring layer having a plurality of protrusions protruding into spaces defined between the adjacent ones of the wirings of the second wiring layer, (Second embodiment of the wiring board)

According to the present invention, there is also provided a method for manufacturing a multilayered wiring board, comprising: a first step of forming a first mesh wiring layer having a plurality of holes formed therein; a second step of forming a plurality of protrusions on the first wiring layer by partially reducing the thickness thereof; a third step of forming an insulating layer on the first wiring layer; and a fourth step of forming a second wiring layer on the insulating layer, the second wiring layer comprising a plurality of wirings that extend between the protrusions formed on the first wiring layer. (Second embodiment of the method)

According to the present invention there is also provided a method of manufacturing a multilayered wiring board, comprising: a first step of providing a protrusion-formed layer having a plurality of protrusions, a second step of providing a first wiring layer on the protrusion-formed layer so as to form a plurality of protrusions on the first wiring layer at portions right over the protrusions of the protrusion-formed layer; a third step of providing an insulating layer on the first wiring layer; and a fourth step of providing a second wiring layer comprising a plurality of wirings that extend between the protrusions formed on the first wiring layer. (Third embodiment of the method)

With the multilayered wiring board according to the first embodiment, the wirings of the second wiring layer undulate up and down so as to partially descend into the holes formed in the first wiring layer. This increases the electrostatic coupling between the wirings of the second wiring layer and the first wiring layer. If the first wiring layer is grounded and signals are transmitted through the wirings of the second wiring layer, crosstalk between the wirings of the second wiring layer can be reduced to a low level due to a strong electrostatic coupling between the wirings of the second wiring layer and the first wiring layer.

With the method of manufacturing a multilayered wiring layer according to the first embodiment, an insulating layer is formed on the meshed first wiring layer. Recesses are formed in the insulating layer at portions right over the holes in the first wiring layer. Thus, the wirings of the second wiring layer are bent along the recesses formed in the insulating layer and descend into the holes of the first wiring layer.

With the multilayered wiring board of the second embodiment, the profusions formed on the first wiring layer extend into the spaces defined between the adjacent wirings of the second wiring layer. This increases the electrostatic coupling between the wirings of the second wiring layer and the first wiring layer. Namely, the electrostatic coupling therebetween is greater than the electrostatic coupling between the respective wirings of the second wiring layer. Thus, crosstalk between the respective wirings of the second wiring layer can be reduced to a low level.

With the manufacturing method of the second embodiment, a plurality of protrusions are formed on the meshed first wiring layer and an insulating layer is formed on the first wiring layer. A second wiping layer comprising a plurality of wirings is further laminated on the insulating layer so that the wirings extend between the protrusions of the first wiring layer. The protrusions of the first wiring layer protrude into the spaces between the wirings of the second wiring layer.

With the manufacturing method of the third embodiment, the first wiring layer is formed on a protrusion-formed layer having a plurality of protrusions. Protrusions are thus formed on the first wiring layer at portions right over the protrusions of the protrusion-formed layer. An insulating layer is provided on the first wiping layer. A second wiring layer comprising a plurality of wirings is formed on the insulating layer so that the wirings extend between the protrusions of the first wiring layer. Namely, the protrusions of the first wiring layer protrude into the spaces between the wirings of the second wiring layer.

BRIEF DESCRIPTION OF THE DRAWINGS

Other features and objects of the present invention will become apparent from the following description made with reference to the accompanying drawings, in which:

FIGS. 4A–4J are views illustrating one embodiment of the manufacturing method according to the present invention;

FIG. 8 is a top plan view of the wiring board of FIG. 7;

FIGS. 9A–9C are sectional views of the wiring board of FIG. 7;

FIGS. 10A–10L are views illustrating another embodiment of the manufacturing method according to the present invention;

FIGS. 12A–12K are views illustrating a further embodiment of the manufacturing method according to the present invention,

DETAILED DESCRIPTION OF THE PREFERRED EMBODIMENTS

First, the embodiments of the multilayered wiring board according to the present invention will be described.

Figure 1:
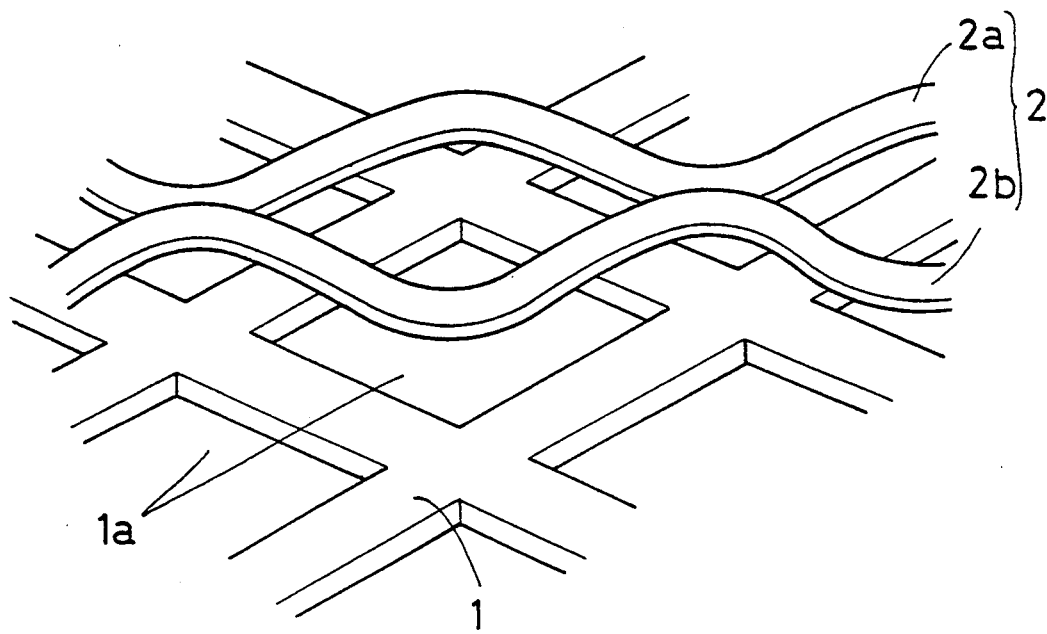
FIG. 1 is an enlarged perspective view of a portion of one embodiment of the multilayered wiring board according to the present invention.

FIG. 1 is an enlarged perspective view of a portion of one embodiment, The multilayered wiring board has a first wiring layer 1 and a second wiring layer 2 which is laminated over the first layer through an insulating layer (not shown). The first wiring layer 1 is mesh-shaped and has numerous holes 1a. The second wiring layer 2 comprises wirings 2a and 2b which undulate up and down so as to descend into the holes 1a formed in the first wiring layer 1.

Figure 2:
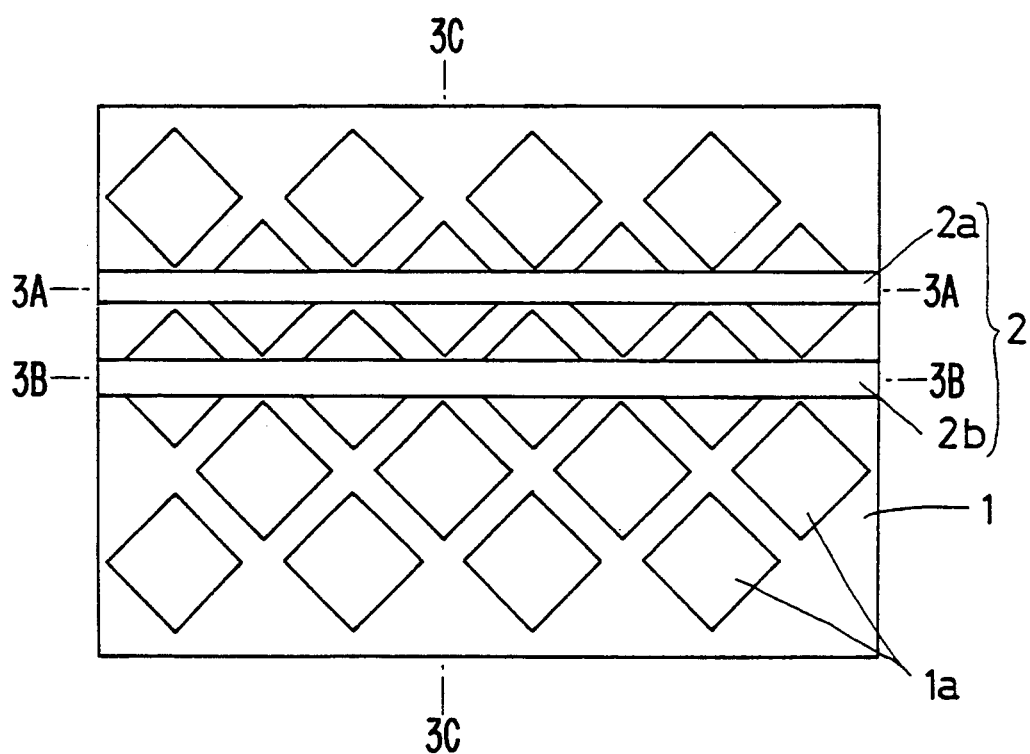
FIG. 2 is a top plan view of the multilayered wiring board of FIG. 1.

FIG. 2 is a top plan view of the multilayered wiring board of this embodiment, As is apparent from this figure, the holes 1a formed in the first wiring layer 1 are square and arranged regularly in a plurality of rows, The wiring 2a extends along the diagonals lines of the holes 1a arranged in a single row, The wiring 2b extends along the diagonals lines of the holes 1a in the next row, Thus, the distance or pitch between the axes of the wirings 2a and 2b is substantially equal to half the length of the diagonal of each hole, For example, if the diagonal of each hole 1a is 100 microns, the pitch of the wirings 2a and 2b will be 50 microns, If the pitch is 50 microns, the width of each of the wirings 2a and 2b are set to be 25 microns, which means that the space between wirings is also 25 microns, These wirings 2a and 2b extend into all of the holes 1a one after another.

Figure 3A:
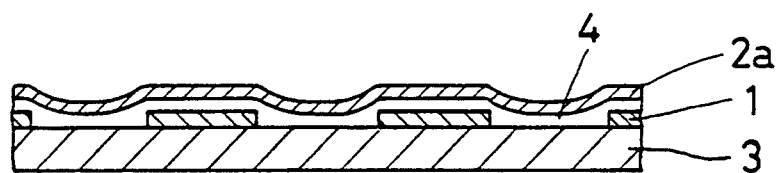
FIGS. 3A–3C are sectional views of the multilayered wiring board of FIG. 1.
Figure 3B:
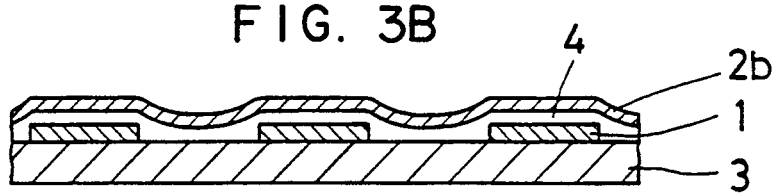
Figure 3C:
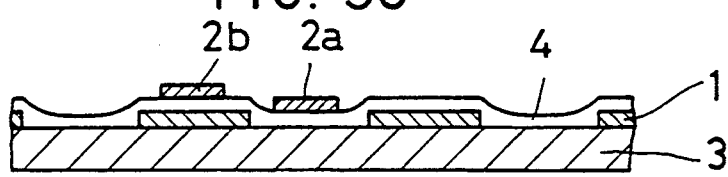

FIG. 3A is a sectional view taken along line 3A—3A of FIG. 2, FIG. 3B is a view section taken along line 3B—3B of FIG. 2, and FIG. 3C is a sectional view taken along line 3C—3C.

As shown in these figures, the first wiring layer 1 is formed on a board 3. An insulating layer 4 is also formed in the board so as to cover the wiring layer 1. The insulating layer 4 is recessed right over the holes 1a in the first wiring layer 1. Since the wirings 2a and 2b are provided to overlie the insulating layer 4, they also descend at portions right over the holes 1a into the first wiring layer 1.

Thus, the distance between the wirings 2a and 2b and the first wiring layer 1 is short at these portions, so that the electrostatic couplings between the wiring 2a and the first wiring layer 1 and between the wiring 2b and the first wiring layer 1 are strong at these portions. With this arrangement, if the mesh-shaped first wiring layer 1 is grounded while using the wirings 2a and 2b as signal transmission lines, crosstalk between the wirings 2a and 2b can be kept at a low level. Also, the holes 1a are arranged in a staggered manner, the and wirings 2a and 2b undulate up and down so that when one wiring 2a descends into the hole 1a, the other wiring 2b remains above the hole, and vice versa, With this arrangement, the distance between the wirings 2a and 2b can be kept large. Thus, crosstalk between the wirings 2a and 2b can be reduced still further.

Preferably, the second wiring layer 2 should descends into the holes 1a in the first wiring layer 1 by an amount within the range of 1–5 microns. If this amount is less than 1 micron, crosstalk cannot be suppressed sufficiently. If larger than 5 microns, it is difficult to form the second wiring layer 2 with high dimensional accuracy.

Figure 5:
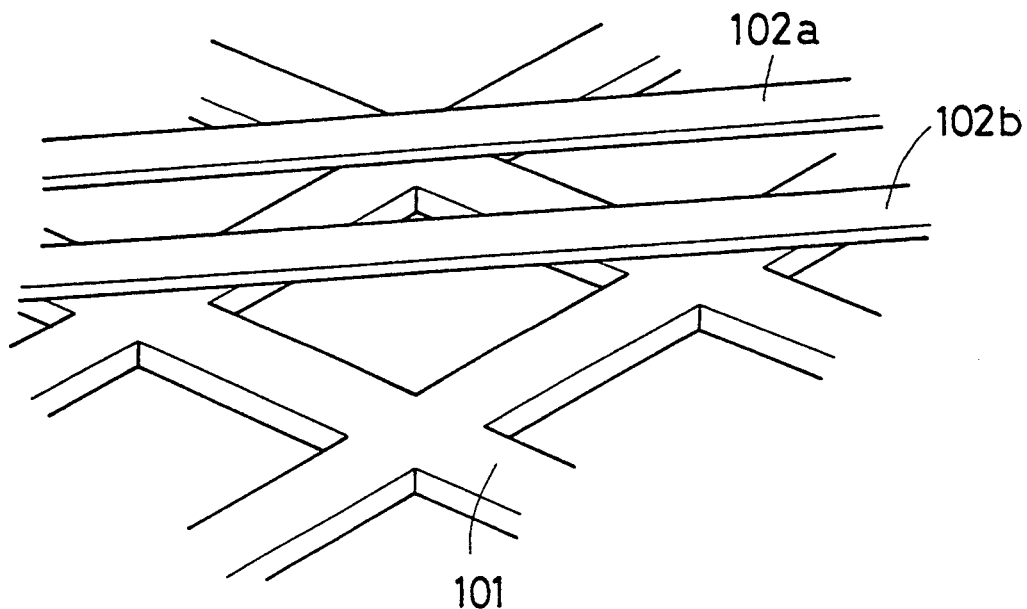
FIG. 5 is an enlarged perspective view of a portion of a conventional multilayered wiring board.
Figure 6A:
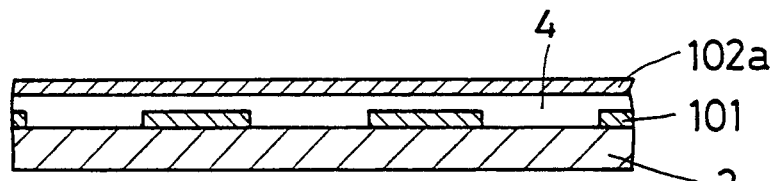
FIGS. 6A–6C are sectional views of the wiring board of FIG. 5.
Figure 6B:
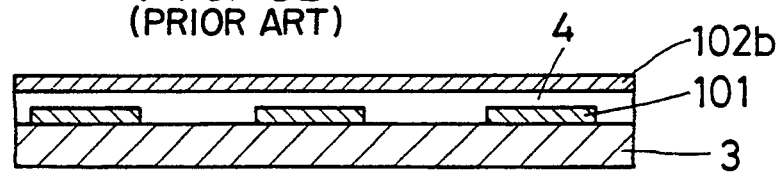
Figure 6C:
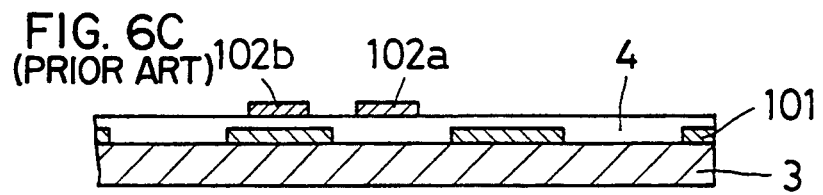

FIG. 5 shows a conventional multilayered wiring board, in which straight wirings 102a and 102b are provided on the top of a meshed wiring layer 101 through an insulating layer (not shown). FIGS. 6A, 6B and 6C are sectional views of this wiring board, each corresponding to FIGS. 3A, 3B and 3C, respectively, As will be apparent from these figures, compared with the embodiment of the present invention, the wirings 102a and 102b are rather spaced apart from the meshed wiring layer 101 and the distance between the wirings 102a and 102b is short. Crosstalk between the wirings 102a and 102b is thus high.

Next, a method of manufacturing the multilayered wiring board according to the first invention shown in FIGS. 1–3 will be described with reference to FIGS. 4A–4J.

First, we will describe the first embodiment of the manufacturing method, (step a)

The surface of a board 5 made of Al$_2$O$_3$ is polished to provide a mirror finish.

(step b)

A metal film is formed by deposition, on the board 3 to form the first wiring layer 1. The metal film has a three-layer structure comprising a 0.1-micron thick Cr film, a 5-micron thick Cu film and a 0.1-micron thick Cr film laminated one on another so that the total thickness will be about 5 microns, (step c)

A resist pattern 11 that represents the mesh pattern is formed on the first wiping layer 1 by photolithography.

(step d)

The Cr and Cu films of the metal films forming the first wiring layer 1 are subjected to wet etching using red prussiate and ferric chloride etching solutions to form the first wiring layer 1 into the shape of mesh.

(step e)

The resist pattern 11 is stripped off.

(step f)

A photosensitive polyimide varnish containing 17.5% of a resinous component is applied to the surface of the first wiring layer 1. Since the resinous component content of the polyimide varnish is low, it will be depressed, when hardened later, at portions right over the holes 1a formed in the first wiring layer 1, thus forming an insulating layer 4 having a plurality of recesses.

(step g)

The photosensitive polyimide varnish is exposed to light, developed and cured to form a 10-micron thick insulating layer 4, The conditions are adjusted to have recesses about 2 microns deep, The insulating layer 4 is also formed with vias 12.

(step h)

A metal film is deposited on the insulating layer 4 by sputter-deposition to form a second wiring layer 2.

(step i)

A resist pattern 13 that represents a wiring pattern is formed on the second wiring layer 2 by photolithography. The first wiring layer 1 and the second wiring layer 2 are connected together through the vias 12. The connection through the vias 12 is not illustrated in FIGS. 1–3.

(step j)

The second wiring layer 2 is subjected to wet etching to shape the second wiring layer 2 into a predetermined pattern. Then the resist pattern 13 is stripped off.

The above-mentioned manufacturing steps were controlled so that each hole 1a formed in the first wiring layer 1 had a diagonal of 100 microns, the width of each wiring 2a and 2b and the gap therebetween when 25 microns and the length of each wirings 2a, 2b where 135 mm. Crosstalk between the wirings 2a and 2b of the multilayered wiring board thus formed was about −40 dB at 1 GHz, Next, the second embodiment of the manufacturing method according to the present invention will be described. In the second embodiment, Steps a–e and Steps h–j are similar to those in the first embodiment. Thus, they will be described only briefly.

(step a)

The surface of the board 3 is polished to provide a mirror finish.

(step b)

A metal film is formed, by deposition, on the board 3 to form the first wiring layer 1.

(step c)

A resist pattern 11 is formed on the first wiring layer 1.

(step d)

The first wiring layer 1 is subjected to etching to form it into the shape of mesh.

(step e)

The resist pattern 11 is stripped off.

(step f)

A coating of a non-photosensitive polyimide varnish having the a resinous component content of 19% is provided on the surface of the first wiring layer 1. Since the resinous component content is low, it will be depressed, when hardened later, at portions right over the holes 1a formed in the first wiring layer 1, thus forming an insulating layer 4 having a plurality of recesses.

(step g)

The non-photosensitive polyimide varnish is cured to form an insulating layer 4 of polyimide having a suitable thickness and formed with recesses of suitable depth. Further, although not shown, a resist pattern is formed on the insulating layer 4 by photolithography, The insulating layer is subjected to etching with oxygen plasma to form via holes 12, The resist pattern is of course stripped off.

(step h)

The second wiring layer 2 is formed on the insulating layer 4.

(step i)

A resist pattern 13 is formed on the second wiring layer 2.

(step j)

The second wiring layer 2 is subjected to etching to shape it into a predetermined pattern. Then, the resist pattern 13 is stripped off.

Next, the third embodiment of the manufacturing method according to the present invention will be described. In the third embodiment, Steps a–e and Steps h–j are similar to those in the first and second embodiments. Thus, they will be described only briefly.

(step a)

The surface of the board 3 is polished to provide a mirror finish.

(step b)

A metal film is formed, by deposition, on the board 3 to form the first wiring layer 1.

(step c )

A resist pattern 11 is formed on the first wiring layer 1.

(step d)

The first wiring layer 1 is subjected to etching to form it into the shape of mesh.

(step e)

The resist pattern 11 is stripped off.

(step f)

A coating of a non-photosensitive polyimide varnish having a resinous component content of 50% is provided on the surface of the first wiring layer 1 and the coating is hardened to form a polyimide layer, Since the resinous component content is high, the surface of the hardened polyimide resin is not depressed but kept flat.

(step g)

Etching treatment is conducted twice.

First, a resist pattern is formed on the polyimide layer so as to cover its entire surface except at locations where it is intended to form vias 12. Then, etching is performed using oxygen plasma so that the thickness of the polyimide layer is reduced by half at the portions where the vias 12 are to be formed. The resist pattern is then stripped off.

A resist pattern is again formed on the polyimide layer so as to completely cover at surface except its locations where the vias 12 are formed and portions right over the holes la in the first wiring layer 1. Then, etching is carried out again so as to remove the latter half of the thickness of the polyimide layer at location where the vias 12 are formed and thus to completely form the vias. Further, by this etching treatment, the thickness of the polyimide layer is also reduced by half at locations right over the holes la formed in the first wiring layer 1. In other words, the polyimide layer is depressed at locations right over the holes 1a in the first wiring layer 1. Then, the resist pattern is stripped off to complete the insulating layer 4.

(step h)

The second wiring layer 2 is formed on the insulating layer 4.

(step i)

A resist pattern 13 is formed on the second wiring layer 2.

(step j)

The second wiring layer 2 is subjected to etching treatment to shape it into a predetermined pattern. Then, the resist pattern 13 is stripped off.

In the embodiments of the manufacturing method according to the present invention, the wiring board is formed by laminating a first wiring layer 1, an insulating layer 4 and a second wiring layer 2. But, another set of layers, namely the first wiring layer 1, insulating layer 4 and second wiring layer 2, may be formed on the first set of these layers by repeating the above-mentioned steps b–j. Before forming the second set of layers, however, it is necessary to provide an insulating layer on the second wiring layer of the first set and to smoothen its top surface. A plurality of such additional sets of layers may be provided. Also, such treatment may be started from any layer in a multilayered wiring board.

In the embodiments, the wiring layers are made of Cu and Cr and the insulating layer is of a polyimide. But they may be made of different materials. For example, the wiring layers may be made of Al and the insulating layer may be of $SiO_2$ or SiN.

We will now describe another embodiment of the multilayered wiring board according to the present invention.

Figure 7:
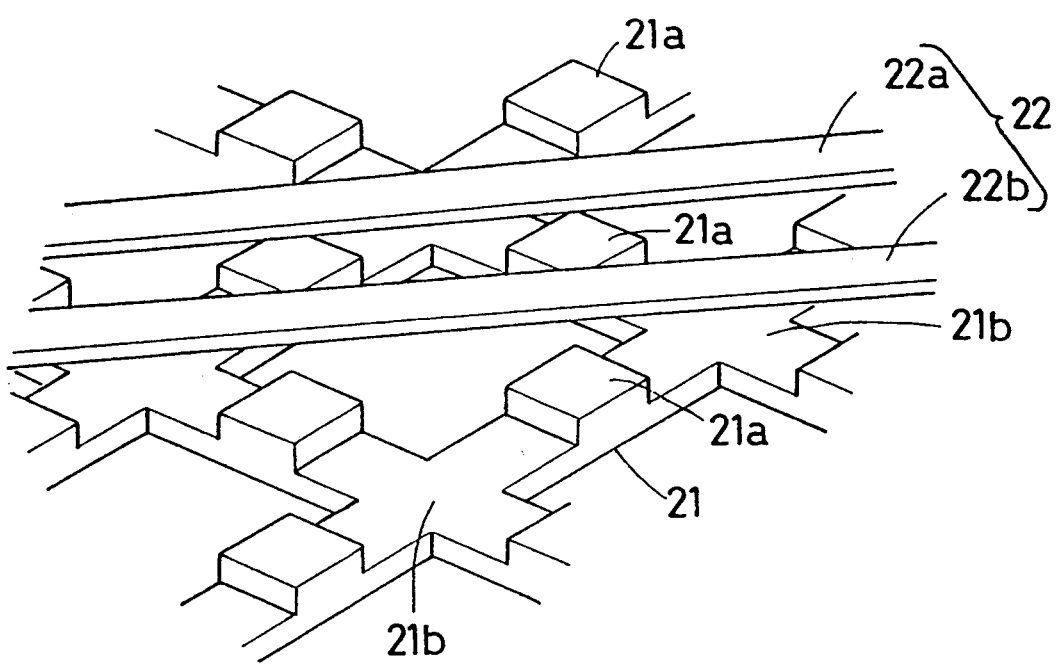
FIG. 7 is an enlarged perspective view of a portion of another embodiment of the multilayered wiring board according to the present invention.

FIG. 7 is an enlarged perspective view of a portion of the embodiment of the multilayered wiring board. FIG. 8 shows it in plan. FIGS. 9A, 9B and 9C are sectional views taken along lines 9A—9A, 9B—9B and 9C—9C.

As will be apparent from these figures, a first wiring layer 21 has a mesh structure with numerous holes formed therein. A second wiring layer 22 comprises a wiring 22a and 22b. On the other hand, the wiring layer 21 is formed on a board 23 of $Al_2O_3$. An insulating layer 24 is disposed between the first and second wiring layers 21 and 22 (the board 23 and the insulating 24 are shown in FIG. 9). The wiring layer 22 actually comprises numerous wirings. But in the figures, we show only two adjacent wirings.

Each of the wirings 22a and 22b of the second wiring layer 22 extends diagonally over intersections 21b of the mesh pattern of the first wiring layer 21. Between the adjacent intersections 21b, the first wiring layer 21 has protrusions 21a. Thus, as viewed from top, the protrusions 21a are disposed between the adjacent wirings 22a and 22b of the second wiring layer 22 (FIG. 8).

Thus, the distance between each intersection 21b of the mesh pattern of the first wiring layer 21 and the second wiring layer 22 is greater than the distance between any other portion of the first wiring layer 21 and the second wiring layer 22.

In this embodiment, the wirings 22a and 22b of the second wiring layer 22 are arranged at a pitch of 50 microns (each wiring being 25 microns wide, the space therebetween being 25 microns wide). The mesh pattern of the first wiring layer 21 has a diagonal pitch of 100 microns, i.e. twice the pitch of the wirings 22a and 22b. The distance between each intersection 21b of the first wiring layer 21 and the second wiring layer 22 is 6 microns, the protrusions 21a of the first wiring layer 21 being 3 microns high. The second wiring layer 22 has a constant thickness of 5 microns, The wirings 22a and 22b extend in a straight line, The electrical properties of the wiring board of this embodiment concerning crosstalk were measured. The level of crosstalk between the wirings 22a and 22b each 15.5 mm long was about $-40$ dB at 1 GHz.

In this embodiment, the protrusions 21a of the first wiring layer 21 are 3 microns high. However, their height may be within a range of 1–10 microns according to the distance between the first and second wiring layers 21 and 22 and the wiring pattern of the second wiring layer 22.

Let us now compare the wiring board of this embodiment with the conventional wiring board shown in FIGS. 5 and 6. The wiring board of this embodiment has protrusions 21a Formed on the first wiring layer 21 so as to be disposed between the wirings 22a and 22b of the second wiring layer 22 as viewed from the top. It is apparent that the conventional wiring board has no such protrusions. Thus, with the wiring board of this embodiment, the electrostatic coupling between first wiring layer 21 and the wirings 22a and 22b is greater than the electrostatic coupling between the wirings 22a and 22b. This means that crosstalk between the wirings 22a and 22b can be deduced to a sufficiently low level by e.g. grounding the first wiring layer and using the wirings 22a and 22b of the second wiring layer 22 as signal transmission lines.

Now, referring to FIG. 10, we will describe another manufacturing method according to the present invention, that is, a method for manufacturing the multilayered wiring board shown in FIGS. 7–9. In FIG. 10, the protrusions 21a of the first wiring layer 21 and its portions where holes are formed are shown in an exaggerated manner so as to facilitate an understanding of the structure.

(step a)

The surface of a board 23 made of $Al_2O_3$ is polished to provide a mirror finish.

(step b)

A metal film is formed, by deposition, on the board 23 to form the first wiring layer 21. The metal film has a five-layer structure comprising a 0.1-micron thick Cr film, a 3-micron thick Cu film, a 0.1-micron thick Cr film, a 3-micron thick Cu film and a 0.1-micron thick CF film, the total thickness being about 6 microns.

(step c)

A resist pattern 25 that represents the mesh pattern of the first wiring layer 21 is formed by photolithography.

(step d)

The Cr and Cu films forming the first wiring layer 1 are subjected to wet etching using red prussiate and ferric chloride etching solutions to form the upper two metal layers (Cr and Cu layers) into the shape of mesh.

(step e)

The resist pattern 25 is stripped off.

(step f)

A resist pattern 26 is subjected to photolithography to form protrusions 21a on the first wiping layer 21.

(step g)

Wet etching is carried out again to etch the top three of the metal layers formed in Step d.

(step h)

The resist pattern 26 is stripped off to complete the first mesh wiring layer 21 having the protrusions 21a.

(step i)

A non-photosensitive polyimide varnish is applied to the surface of the first wiring layer 21. It was then cured in nitrogen to form a 12-micron thick insulating layer 24.

(step j)

A resist pattern for vias is formed on the insulating layer 24 and the latter is subjected to dry etching with oxygen plasma using a reactive ion etching apparatus to form vias 24a in the insulating layer 24.

(step k)

A metal film as the second wiring layer 22 is deposited on the insulating layer 24. This metal film has a three-layer structure comprising a 0.1-micron thick Cr film, a 5-micron thick Cu film and a 0.1-micron thick Cr film.

(step l)

A wiping pattern is formed in the second wiring layer 22 by photolithography and etching.

On the laminated structure thus formed, the following layers were further laminated one on another in the manner as described above: a polyimide insulating layer; a second wiring layer having a predetermined wiring pattern; a poiyimide insulating layer; a first mesh wiring layer: a polyimide insulating layer; and a second wiring layer having a predetermined wiring pattern. A multilayered wiring board having three layers of wiring patterns and two layers of mesh patterns was obtained.

Figure 11:
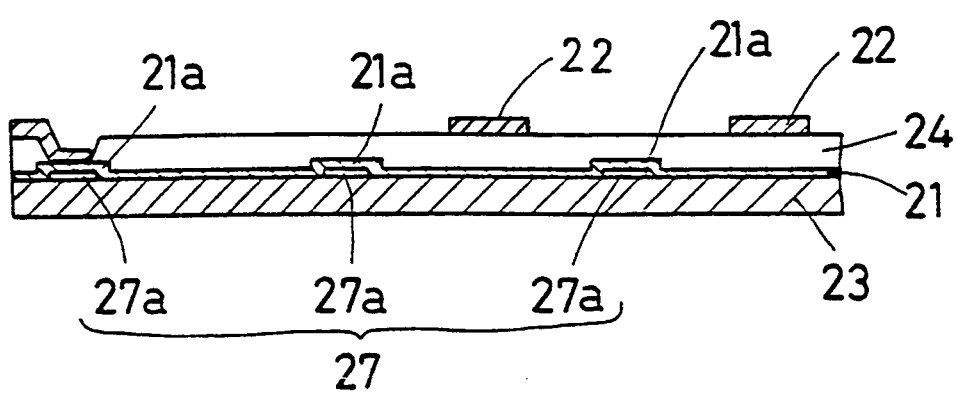
FIG. 11 is a sectional view of a further embodiment of the multilayered wiring board.

Now referring to FIG. 11, we will describe another embodiment of the multilayered wiring board according to the present invention, For simplicity we show in FIG. 11 only a section taken in the same direction of line 9C—9C of FIG. 8. Other sections are omitted.

This embodiment is different from the multilayered wiring board shown in FIGS. 7-9 in that it has a layer 27 having protrusions 27a. Also, the first wiring layer 21 has a sectional shape different from that of the embodiment of FIGS. 7-9. A first wiring layer 21 having a uniform thickness is laminated on the layer 27. Thus, protrusions 21a are formed on the first wiring layer 21 at portions right over tile protrusions 27a. This arrangement of course serves to increase the electrostatic coupling between the wirings of the second wiring layer 22 and the first wiring layer 21, so that crosstalk between the wirings of the second wiring layer 22 can be kept at a low level.

Now referring to FIG. 12, we will describe another method of manufacturing the above-described multilayered wiring board.

(step a)

The surface of a board 25 made of $Al_2O_3$ is polished to provide a mirror finish.

(step b)

A photosensitive polyimide varnish is applied to the surface of the board 23 with a spinner. Then the board is exposed to light, developed and cured to form a layer 27 having square protrusions 27a arranged in a lattice pattern and having a thickness of 3 microns.

(step c)

A metal film is deposited on the layer 27 by sputtering to form the first wiring layer 21. The metal film has a three-layer structure comprising Cr, Cu and Cr layers, the total thickness being 5 microns.

(step d)

A resist pattern 25 that represents the mesh pattern is formed by photolithography.

(step e)

The Cr and Cu films forming the first wiring layer 21 are subjected to wet etching using red prussiate and ferric chloride etching solutions to form a first wiring layer 21 having a mesh wiring pattern.

(step f)

The resist pattern 25 is stripped off.

(step g)

A non-photosensitive polyimide varnish is applied to the surface of the first wiring layer 21 to form the insulating layer 24.

(step h)

Vias 24a are formed in the insulating layer 24 by photolithography and etching with oxygen plasma.

(step i)

A metal film is deposited on the insulating layer 24 to form a second wiring layer 22.

(step j)

Resist patterning and wet etching are carried out.

(step k)

The resist pattern is removed to form the second wiring layer 22.

In the embodiments according to the present invention, the wiring layers are made of Cu and Cr while the insulating layers are made of polyimide. However, these layers may be made of any other material. For example, the wiring layers may be made of Al or the insulating layers may be made of $SiO_2$ or SiN.

What is claimed is:

1. A multilayered wiring board having a multilayered wiring structure, said wiring board comprising: a first mesh wiring layer having a plurality of holes therein; and a second wiring layer having a plurality of wirings; said wirings of said second wiring layer undulating up and down toward and away from said first layer and having portions descending toward said holes in said first wiring layer.

2. A multilayered wiring board as claimed in claim 1, and further comprising an insulating layer provided between said first wiring layer and said second wiring layer; said insulating layer having recesses that are located over said holes in said first wiring layer; said portions of the wirings of said second wiring layer descending into said recesses in said insulating layer and thus toward said holes in said first wiring layer.

3. A multilayered wiring board having a multilayered wiring structure, said wiring board comprising: a first mesh wiring layer having a plurality of holes therein; and a second wiring layer having a plurality of wirings; said first wiring layer having a plurality of protrusions protruding from the remainder of the first wiring layer toward said second wiring layer at locations between adjacent ones of said wirings of said second wiring layer.

4. A multilayered wiring board as claimed in claim 3, and further comprising an insulating layer disposed between said first wiring layer and said second wiring layer.

5. A multilayered wiring board as claimed in claim 3, wherein said second wiring layer is flat and has a constant thickness.

6. A multilayered wiring board as claimed in claim 3, wherein said first wiring layer is thicker at portions thereof where said protrusions are located than at the other portions of the first wiring layer.

7. A multilayered wiring board as claimed in claim 3, wherein said first wiring layer has a constant thickness even at portions thereof where said protrusions are located.

* * * * *